United States Patent [19]
Millar et al.

[11] Patent Number: 5,497,115
[45] Date of Patent: Mar. 5, 1996

[54] FLIP-FLOP CIRCUIT HAVING LOW STANDBY POWER FOR DRIVING SYNCHRONOUS DYNAMIC RANDOM ACCESS MEMORY

[75] Inventors: Bruce Millar, Stittsville, Canada; Richard C. Foss, Kirkcaldy Fife, Scotland; Tomasz Wojcicki, Kanata, Canada

[73] Assignee: Mosaid Technologies Incorporated, Kanata, Canada

[21] Appl. No.: 235,647

[22] Filed: Apr. 29, 1994

[51] Int. Cl.$^6$ ................................................ H03K 3/356
[52] U.S. Cl. ........................ 327/211; 327/199; 327/208; 327/215
[58] Field of Search ..................... 327/198, 199, 327/200, 201, 202, 203, 204, 205, 206, 207, 208, 209, 210, 211, 212, 213, 214, 215, 216, 217, 218, 219; 326/119

[56] References Cited

U.S. PATENT DOCUMENTS

| | | | |
|---|---|---|---|
| 4,800,296 | 1/1989 | Ovens et al. | 327/198 |
| 4,970,406 | 11/1990 | Fitzpatrick et al. | 327/198 |
| 4,980,577 | 12/1990 | Baxter | 327/198 |
| 5,049,760 | 9/1991 | Ooms | 327/212 |
| 5,124,568 | 6/1992 | Chen et al. | 327/208 |
| 5,281,865 | 1/1994 | Yamashita et al. | 327/202 |

*Primary Examiner*—Timothy P. Callahan
*Assistant Examiner*—Kenneth B. Wells
*Attorney, Agent, or Firm*—Pascal & Associates

[57] ABSTRACT

A flip-flop circuit for driving an input circuit of a synchronous dynamic random access memory (SDRAM) including a complementary pair of data inputs for receiving data pulses, a clock input for receiving clock pulses, a capture latch circuit for capturing a bit, having a pair of complementary inputs and a pair of complementary outputs, apparatus for applying data pulses from the complementary data inputs to the inputs of the capture latch, apparatus for triggering the capture latch from the clock pulses, and apparatus for connecting the complementary outputs to each other through a bidirectional holding latch, whereby during coincidence of a rising edge of a clock pulse and the presence of a data pulse of one polarity, the capture latch is enabled to store a bit corresponding to the data pulse, and to drive the pair of complementary outputs, and following the leading edge of a clock pulse and the one polarity of the data pulse the complementary outputs remain driven by the holding latch. The invention utilizes lower standby power in comparison to prior art flip-flop circuits.

6 Claims, 5 Drawing Sheets

5,497,115

FLIP-FLOP CIRCUIT HAVING LOW STANDBY POWER FOR DRIVING SYNCHRONOUS DYNAMIC RANDOM ACCESS MEMORY

FIELD OF THE INVENTION

This invention relates to semiconductor memories, and in particular to a latch useful to capture data entering a dynamic random access memory (DRMA) such as a synchronous dynamic random access memory (SDRAM).

BACKGROUND TO THE INVENTION

When data is to be stored in a DRAM, it is typically captured in latches where it is temporarily stored while the bit lines which are to receive the data prior to storage in storage cell capacitors are precharged. In modern DRSMs, it is desirable to minimize the current drawn, and one of the sources of wasted current is in the latches.

CMOS circuits which have inputs compatible with other logic families, such as TTL, may consume significant static power while inputs remain at static logic levels. In the TTL case, logic "1" inputs can be as low as 2.4 volts, while in a 5 volt CMOS part the input is typically positioned mid-voltage rail, resulting in wasted current.

The standby current in a DRAM is significant because many chips are typically needed for large memory banks. For example, a 4 Mb DRAM has 11 address inputs and several other inputs which must be latched at the start of a memory cycle. Instead of using static latches, DRAM circuits typically make use of dynamic latches in which current can only flow during the actual latching sequence.

Such a circuit is shown in FIG. 1, which is a schematic diagram of a dynamic latch circuit in accordance with the prior art. This circuit is shown in an article by Miyamoto et al in IEEE Journal of Solid State Circuits, 4/90.

A flip flop 1 is used to store a bit and present it to output inverters 3 and 5 for provision to output leads/Ai and Ai. Field effect transistors (FETs) 6 and 7, which have their source-drain circuits in parallel with the output FETs of flip flop 1 are driven from a clock source RA1. Two circuits 8 and 9 each comprised of a series of three FETs are connected respectively between the outputs of flip flop 1 and ground. Two opposite FETs of the both series circuits have a clock source/RA3 applied to their gates, and two opposite FETs of both series circuits have a clock source RA1 applied to their gates. A data input terminal receives data pulses and applies them to the gate of a third FET 11 in one of the series circuits. The gate of the third FET 13 of the other series circuit is connected to a voltage reference.

A clock signal/RA2 is applied to the common terminal of the flip flop 1.

FIG. 1A is a timing diagram of the clock signals RA1, /RA2 and /RA3, which are derived from a master clock signal /RAS. When the input FET 11 conducts due to the presence of a high logic level input data signal, it is compared with the current in a matched reference FET which is preferably set between minimum and maximum TTL input logic levels, the reference level being exhibited as a reference voltage Vref at the gate of FET 13. When the input data exceeds the reference in one polarity direction, the flip flop stores an input data pulse of one polarity, and when it exceeds the reference in the other polarity direction, the flip flop stores an input data pulse of the other polarity.

A reference voltage generator is shown in FIG. 1B. A pair of complementary FETs 15 and 16 have their source-drain circuits connected in series, between a current source I and ground. The gates and drains of both transistors are connected together.

While the latch itself consumes virtually zero static power, the reference voltage generator does consume standby power. In addition, it cannot be used in an SRAM, because it is necessary to synchronize data and clock prior to presentation of the data to the latch, while in an SRAM there is no certainty of whether the data will precede or be later than the clock.

Synchronous DRAMs can utilize different CAS latency modes of operation. For example, for a CAS latency of 1, data which is read by its data bus read amplifier arrives at its output buffer after the clock. For a CAS latency of 3, the data waits for the clock at a stage preceding the output buffer. For a latency of 2 there is a race condition between the data and the clock to the output buffer.

A description of SDRAMs may be found in the article "Synchronous DRAMs: Designing to the JEDEC Standard", in MICRON Design Line, volume 2, Issue 2, No 2Q93.

SUMMARY OF THE PRESENT INVENTION

The present invention is a static flip-flop which utilitizes low or zero standby power, and thus is very desirable for use in modern DRAMs, particularly SDRAMs.

In addition, the present invention is high speed, and is edge triggered, and synchronizes data that it captures to the active edge of a clock, thus making it very useful for SDRAMs. Its propagation delay and its propagation delay dispersion have been found to be very low. It has low dynamic power consumption, while still providing a high edge drive for both Q and Q* outputs. The present invention has been found to be robust, and functional over wide process, temperature and voltage variations.

In accordance with an embodiment of the present invention, a flip-flop circuit for driving an input circuit of a synchronous dynamic random access memory (SDRAM) is comprised of complementary data inputs for receiving data pulses or reference voltage, a clock input for receiving clock pulses, a capture latch circuit for the temporary storage of a bit, having a pair of complementary inputs and a pair of complementary outputs, apparatus for applying data pulses from the data input to the input of the capture latch, apparatus for enabling and disabling the capture latch from the clock pulses, apparatus for precharging the capture latch, apparatus for strongly driving the complementary outputs, and apparatus for connecting the complementary outputs to each other through a bidirectional holding latch, whereby during coincidence of a rising edge of a clock pulse and the presence of a data pulse of one polarity, the capture latch is enabled to store a bit corresponding to the data pulse, and to strongly drive the pair of complementary outputs, and following said leading edge of the clock and said one polarity of the data pulse, the capture latch is precharged and disabled thereby removing strong drive to the complementary outputs which remain driven by the holding latch.

In accordance with another embodiment of the invention, a flip-flop circuit for driving an input circuit of a synchronous dynamic random access memory (SDRAM) comprised of a complementary pair of data inputs for receiving data pulses, a clock input for receiving clock pulses, a capture latch circuit for capturing a bit, having a pair of complementary inputs and a pair of complementary outputs, apparatus for applying data pulses from the complementary data inputs to the inputs of the capture latch, apparatus for triggering the capture latch from the clock pulses, and apparatus for connecting the complementary outputs to each other through a bidirectional holding latch, whereby during coincidence of a rising edge of a clock pulse and the presence of a data pulse of one polarity, the capture latch is enabled to store a bit corresponding to the data pulse, and to drive the pair of complementary outputs, and following the leading edge of a clock pulse and the one polarity of the data pulse the complementary outputs remain driven by the holding latch.

BRIEF INTRODUCTION TO THE DRAWINGS

A better understanding of the invention will be obtained by a consideration of the detailed description below of a preferred embodiment, with reference to the following drawings, in which:

FIG. 1 is a schematic diagram of a dynamic latch circuit in accordance with the prior art, FIG. 1A is a timing diagram of clock signals used in the circuit of FIG. 1, FIG. 1B is a schematic diagram of a reference circuit used in conjunction with the circuit shown in FIG. 1, FIG. 2 is a schematic diagram of a synchronizer flip-flop in accordance with a preferred embodiment of the invention, FIGS. 3A and 3B are timing diagrams showing various signals in the present invention, FIGS. 4A, 4B, 4C and 4D illustrate in block diagram applications for the synchronizer flip-flop with various imports, and FIG. 5 illustrates in block diagram a number of synchronizer flip-flops applied to the front end of an SDRAM.

DESCRIPTION OF A PREFERRED
EMBODIMENT OF THE INVENTION

Figure 1:
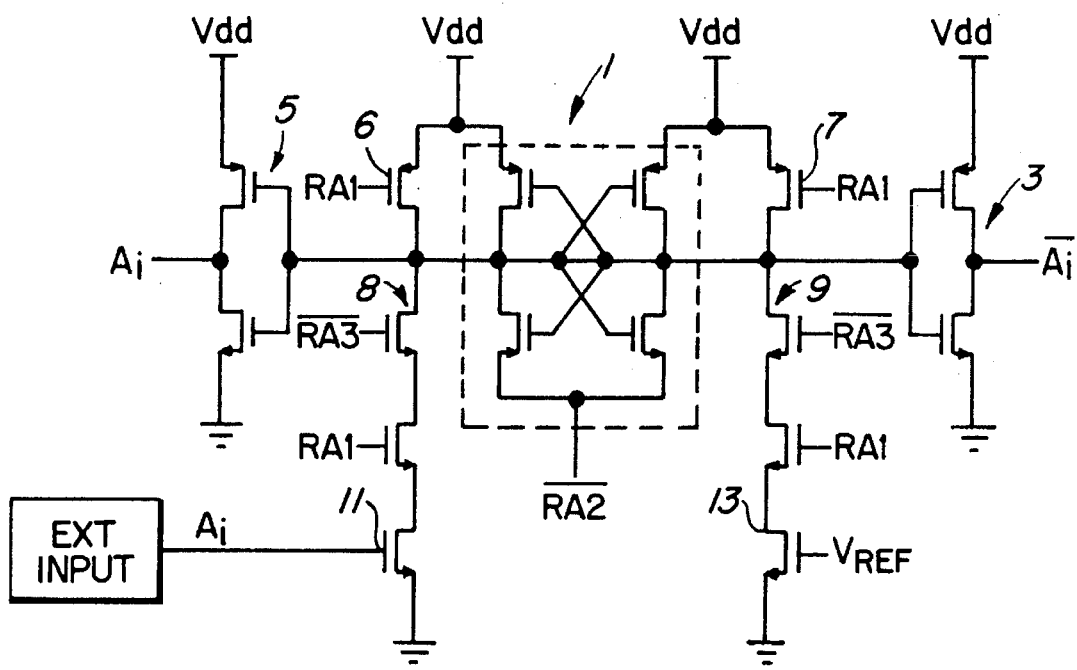
Figure 1A:
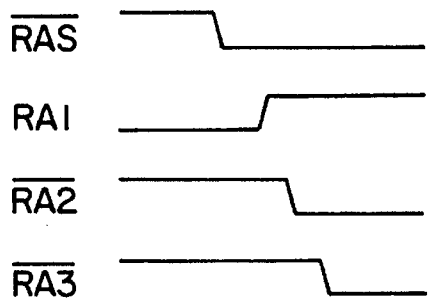
Figure 1B:
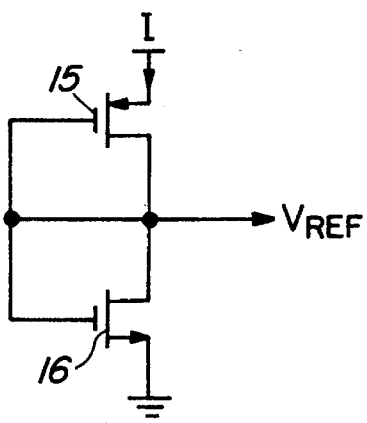
Figure 2:
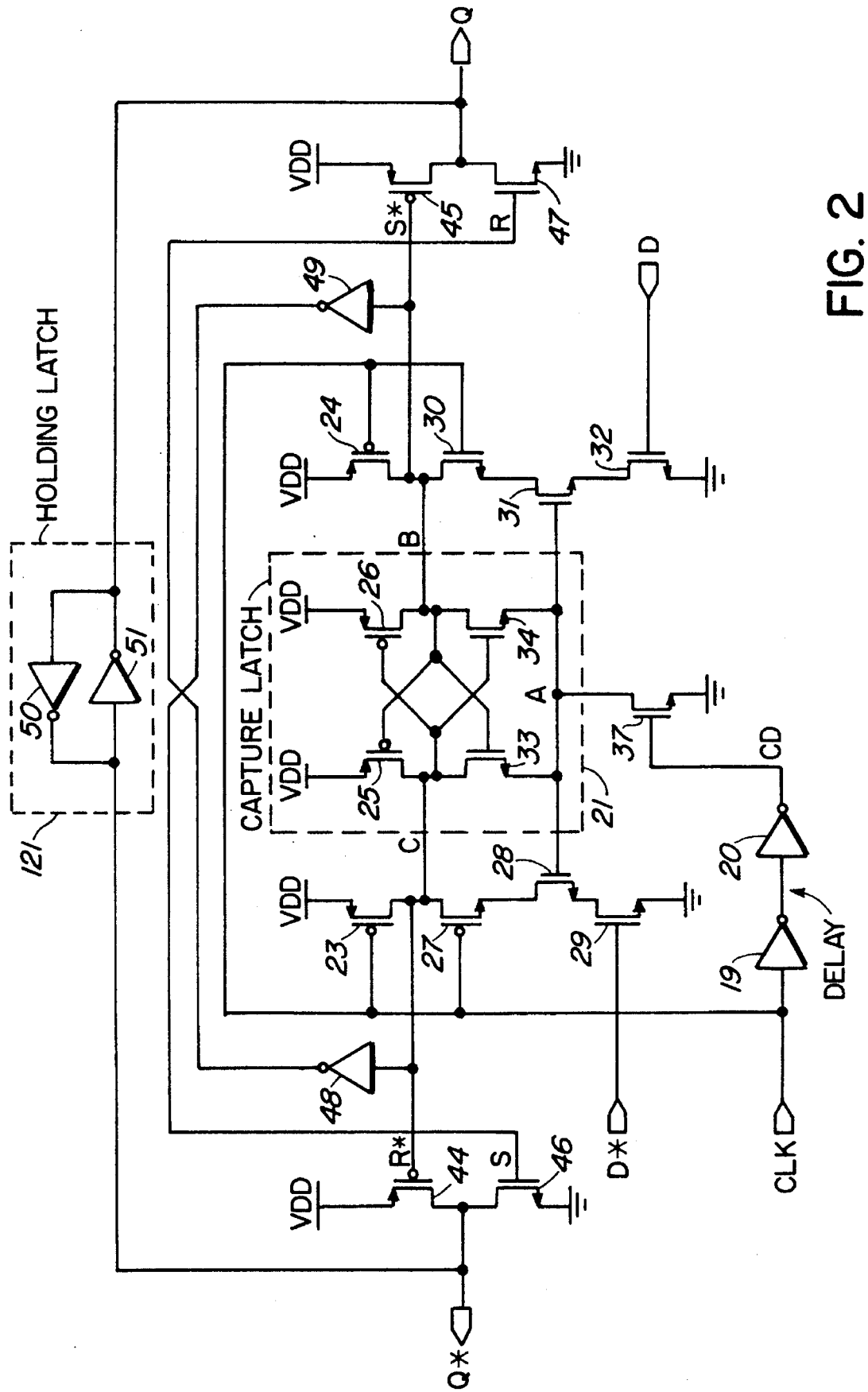

Turning to FIG. 2, a capture latch 21 has a common lead A and a pair of complementary output leads C and B, as in the prior art Miyamoto et al circuit noted above. Also, as in Miyamoto et al, a pair of field effect transistors (FETs) 23 and 24, similar in type to the two FETs 25 and 26 in capture latch 21 that are connected to voltage source Vdd have their source-drain circuits connected in parallel with FETs 25 and 26, and their gates connected together, for receipt of a clock signal CLK. The source-drain circuits of three FETs 27, 28 and 29 of opposite polarity to FET 23 are connected in series, between the junction of FETs 23 and 25 and ground, and the source-drain circuits of three FETs 30, 31 and 32 of opposite polarity to FET 24 are connected in series, between the junction of FETs 24 and 26 and ground. The gates of FETs 23, 24, 27 and 30 are connected together, and the gates of FETs 28 and 31 are connected together and to the sources of crosscoupled FETs 33 and 34 of capture latch 21.

An FET 37 of the same polarity type as FETs 29 and 32 has its drain-source circuit connected between the sources of FETs 33 and 34, and ground.

A clock input CLK is connected to the gates of FETs 23, 27, 24 and 30, and through a series pair of inverters 19 and 20 to the gate of FET 37.

A data input D for supplying the data bits to be stored is connected to the gate of FET 32 and the complementary data input D* is connected to the gate of FET 29.

The outputs C and B of the capture latch 21 are connected to the gates of respective output drive FETs 44 and 45, which are the same polarity types as FETs 23 and 24. The source-drain circuits of FETs 44 and 45 are connected respectively from voltage source Vdd through the drain-source circuits of opposite polarity type FETs 46 and 47 to ground. Output signals are obtained at complementary output terminals Q* and Q respectively.

Capture latch output B is connected through an inverter 49 to the gate of FET 46, and capture latch output C is connected through an inverter 48 to the gate of FET 47. A bidirectional holding latch 121, formed of crosscoupled inverters 50 and 51 is connected between output terminals Q* and Q.

Figure 3A:
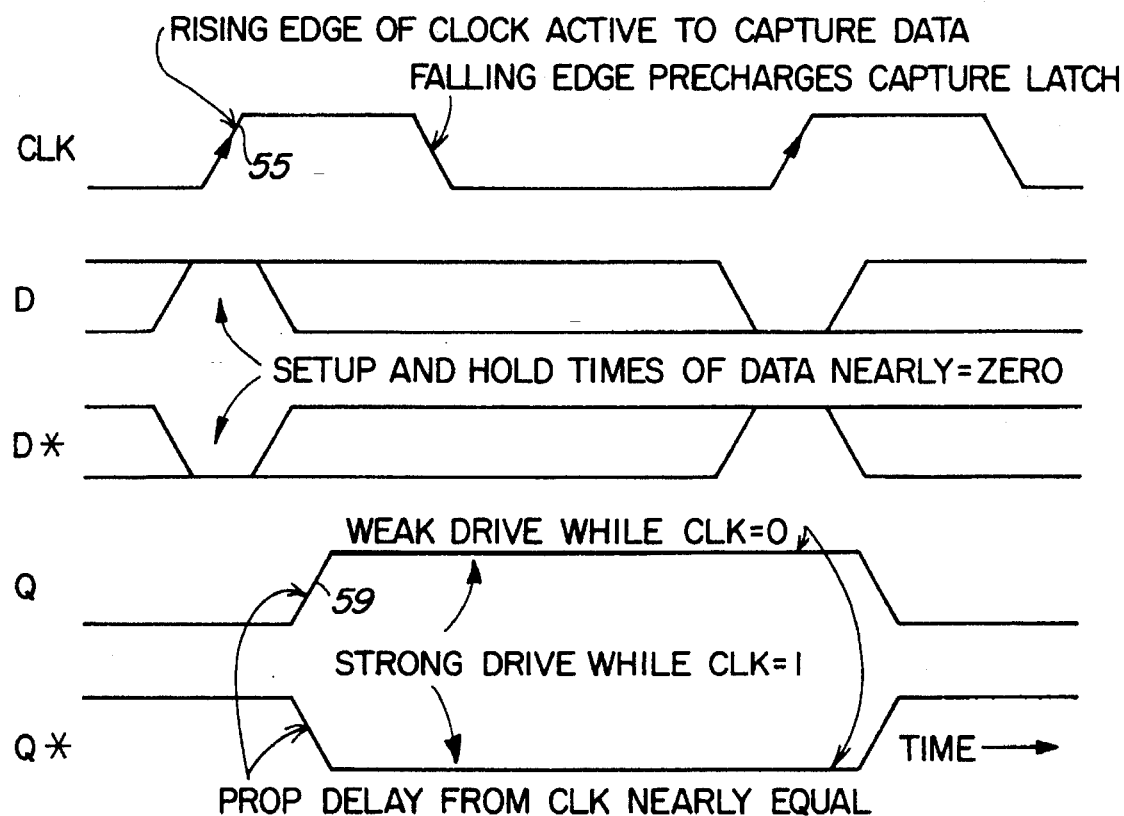
Figure 3B:
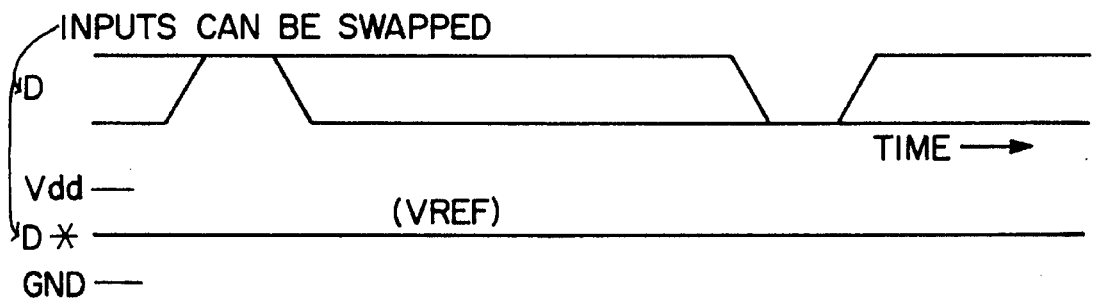

To understand the operation of the circuit, refer now also to the timing diagrams of FIGS. 3 and 3B.

A clock pulse is received at the clock input CLK. This is applied to the gates of FETs 23, 27, 24 and 30, and after a short delay caused by passage through inverters 19 and 20, is applied to the gate of FET 37. The flip flop is thus enabled, to capture and store a data bit.

Following the setup of the data pulse D* and D at FET 29 and 32 input, the leading edge 55 of the clock pulse is received at FETs 23, 27, 24 and 30. As in prior art Miyamoto et al, VREF may be applied to the gate of FET 29, which is held at a logic midpoint level by the threshold circuit described above. However, in the preferred embodiment of this invention, data pulse D* is applied to the gate of FET 29. Since whatever polarity constitutes the data pulse, as it is applied with complementary polarities to the gates of FETs 29 and 32, either FET 29 or FET 32 conducts, and the other FET is inhibited from conducting. Following delay, common terminal A is connected to ground through FET 37 due to the high logic level clock pulse (for the FET polarities shown), and therefore at this time there is no additional effect caused to lead A. However, either one of FETs 29 or 32 has become conductive, causing the source of either of FET 28 or 31 to be connected through to ground.

When lead A goes to ground potential, FETs 28 and 31 are cut off thus blocking effect of D and D* through FETs 29 and 32. Either of capture latch nodes B and C will be pulsed low momentarily through FETs 27 and 30 to disbalance the capture latch as lead A is in transit towards ground. The capture latch amplifies the tiny voltage difference between leads C and B to capture the data.

With leads B and C carrying low and high logic level signals respectively, the inverse logic levels of these signals appear at the gates of FETs 46 and 47 respectively. FET 46 thus conducts, and FET 47 is inhibited. FET 45 conducts, and FET 44 is inhibited. The result is a high logic level signal (conducted from Vdd through FET 45) applied to the output lead Q, and a low logic level signal (conducted from ground through FET 46) applied to the output lead Q*.

The clock pulse ends with a transistion from a high to low logic level, whereby FETs 27 and 30 become non-conductive and FETs 23 and 24 become conductive and after a short delay FET 37 becomes non-conductive. With FETs 27, 30 and 37 non-conductive and FETs 23 and 24 conductive, capture latch output leads B and C "precharge" to the source Vdd causing output driver FETs 44, 45, 46 and 47 to become non-conductive and common lead A to charge towards Vdd through FETs 33 and 34 acting as source followers. Common lead A eventually changes to Vdd minus the threshold voltage of FETs 33 and 34 thereby causing FETs 28 and 31 to become conductive. The synchronizer flip flop is now fully precharged and ready to capture data on the rising edge of the next clock pulse.

The complementary logic levels, which appear across the holding latch formed by inverters 50 and 51, are stored in that latch when the clock goes low and FETs 44, 45, 46 and 47 are off.

Thus it may be seen that the appearance of the complementary logic levels result in data being driven strongly to output leads Q and Q*, with the timing of the clock pulse establishing a high logic level. This is shown in FIG. 3 with the leading edge 59 of high logic level at lead Q, and its complement on lead Q*.

It is important to recognize that maximum current draw occurs during the switching time while the flip flop is flipping into a stable state in one or the other polarity directions. Very low current is drawn when the clock pulse is at a low or high logic level. At no time do FETs 44 and 46 or FETs 45 and 47 conduct simultaneously. As a result, no "crowbar" current is drawn by the output stages Q and Q*. After the circuit has reached a stable state with the holding latch storing the data bit, the amount of current drawn by the circuit drops again to a very low level.

Subsequently, the high logic level pulse of the data may drop to a low level at any time without current being drawn since at this time capture latch common lead A is at ground potential and FETs 28 and 31 are non-conducting. The high logic level at output Q remains at high logic level, and the low logic level at output Q* remains at low logic level.

During the switchover and storage and output of a new bit logic level, the circuit temporarily draws maximum current, as described above with reference to the storage of the initial logic level.

It may thus be seen that the circuit receives, stores and presents a bit to complementary output leads Q and Q*, using maximum current only during the bit logic level storage intervals, but once stored, only minimal current is drawn, except for a short intermediate period at the trailing edge of the high logic level portion of the clock signal where FETs 23 and 24 have become conductive and the capture latch is precharging. While the capture latch is precharging, there is a temporary increase in operation current to a low level that is higher than the aforenoted very low level.

It should be noted that the circuit has the advantage that it synchronizes the data with the clock, which is a necessary requirement should this circuit be used in an SDRAM.

Figure 4A:
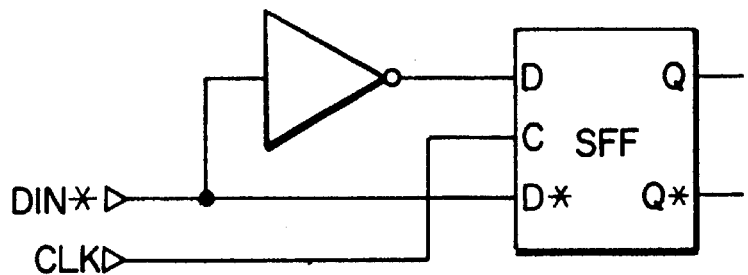
Figure 4B:
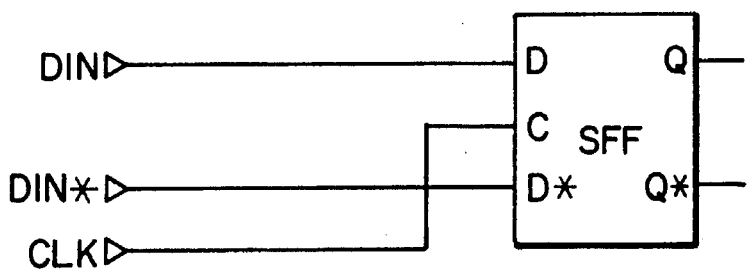
Figure 4C:
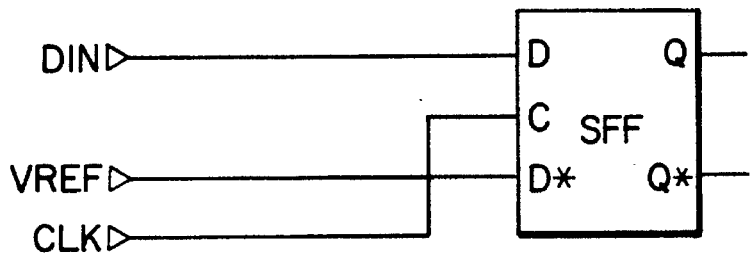
Figure 4D:
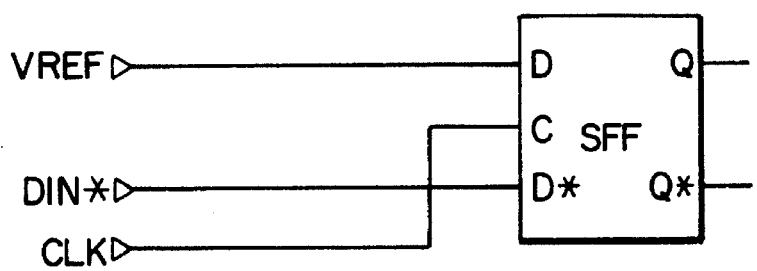

FIGS. 4A, 4B, 4C and 4D illustrate optimal input connections to the synchronizer described above (shown as element 60). In FIG. 4A, an inverter 62 inverts DIN* input data to DIN input data, both being presented to the D* and D inputs respectively to the circuit. In FIG. 4B, complementary data DIN and DIN* are input to the D and D* inputs of the circuit. In FIG. 4C DIN data is applied to the D input with VREF to the D* input while in FIG. 4D VREF is input to the D input with DIN* data to the D* input, VREF being a precise TTL threshold voltage.

Figure 5:
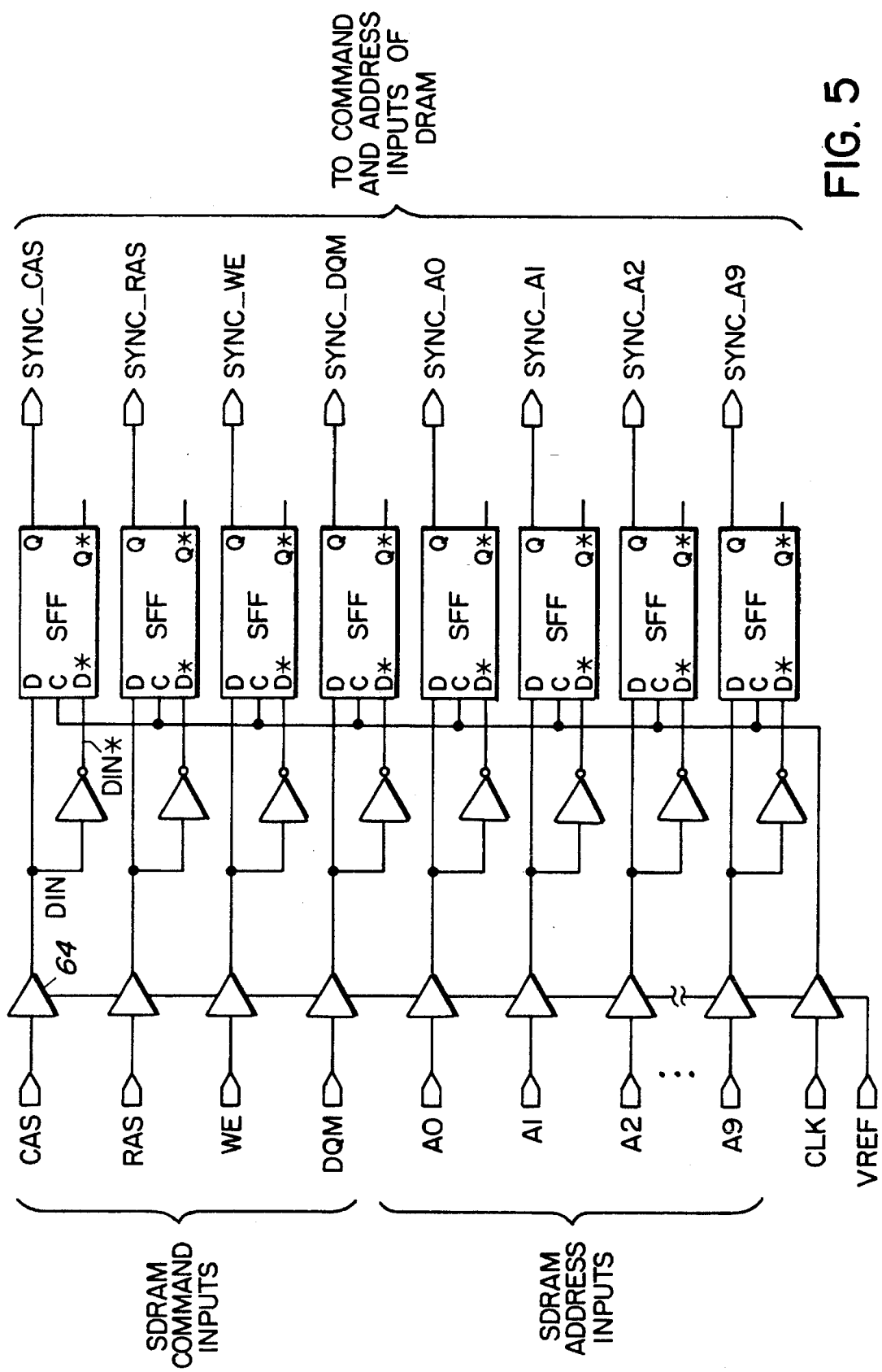

FIG. 5 illustrates the use of a group of synchronizers 60 for correction to the front end of an SDRAM, to provide synchronized command and address inputs thereto. The various SDRAM command address inputs are applied through JTL input buffers 64 as DIN inputs to the synchronizers. Inverters 62 provide the DIN, inputs from the DIN inputs, as described with reference to FIG. 4A. A common clock signal for each synchronizer 60 is obtained via input buffer 66.

A person skilled in the art understanding the description above may now design alternative embodiments and variations using the principles described herein. All those falling within the scope of the claims appended hereto are considered to be part of the present invention.

We claim:

1. A flip-flop circuit for driving an input circuit of a synchronous dynamic random access memory (SDRAM) comprising:

a) a complementary pair of data inputs for receiving data pulses, b) a clock input for receiving clock pulses, c) a capture latch circuit for capturing a data pulse bit, having a pair of complementary inputs and a pair of complementary outputs, d) means for applying data pulses from the complementary data inputs to the inputs of the capture latch, e) means for triggering the capture latch from the clock pulses, and f) means for connecting the complementary outputs to each other through a bidirectional holding latch, whereby during coincidence of a rising edge of a clock pulse and the presence of a data pulse of one polarity, the capture latch is enabled to store said data pulse bit and to drive the pair of complementary outputs, and following said rising edge of a clock pulse and said presence of said data pulse of one polarity the complementary outputs remain driven by the holding latch.

2. A circuit as defined in claim 1 in which drive current of said outputs is lower when driven by the holding latch than when driven by flip flop output drivers.

3. The circuit as defined in claim 2 in which the holding latch comprises a pair of crosscoupled inverters.

4. The circuit as defined in claim 1 in which one of said complementary data inputs is connected to a voltage reference, and further including means for providing said data pulses of one polarity to the other of said complementary data inputs of the flip flop circuit.

5. The circuit as defined in claim 4, in which the voltage reference comprises a complementary pair of field effect transistors having their gates and drains connected together and to said complementary data input, one of said transistors having its source connected to a source of voltage and the other having its source connected to ground.

6. The circuit as defined in claim 1 in which one of the data pulses is a constant reference voltage.

\* \* \* \* \*